United States Patent [19]
Allen et al.

[11] Patent Number: 5,168,178
[45] Date of Patent: Dec. 1, 1992

[54] HIGH SPEED NOR'ING INVERTING, MUX'ING AND LATCHING CIRCUIT WITH TEMPERATURE COMPENSATED OUTPUT NOISE CONTROL

[75] Inventors: Michael J. Allen, Rescue; Terry L. Baucom, Folsom; Diana Esmail-Zandi, Cameron Park, all of Calif.

[73] Assignee: Intel Corporation, Santa Clara, Calif.

[21] Appl. No.: 752,780

[22] Filed: Aug. 30, 1991

[51] Int. Cl.$^5$ .......................................... H03K 19/173
[52] U.S. Cl. .................................... 307/465; 307/443; 307/243; 307/310; 307/468
[58] Field of Search .............. 307/465, 468, 443, 310, 307/445, 243, 491, 448; 365/211

[56] References Cited
U.S. PATENT DOCUMENTS

| | | | |
|---|---|---|---|
| 4,774,421 | 9/1988 | Hartmann et al. | 307/468 |
| 4,857,775 | 8/1989 | Obata et al. | 307/468 |
| 5,023,484 | 6/1991 | Pathak et al. | 307/468 |
| 5,079,450 | 1/1992 | Win et al. | 307/445 |

Primary Examiner—Edward P. Westin
Assistant Examiner—Andrew Sanders
Attorney, Agent, or Firm—Blakely, Sokoloff, Taylor & Zafman

[57] ABSTRACT

The present invention discloses an improved two-stage macrocell for Programmable Logic Devices. According to the first stage of the improved circuit of the present invention's macrocell, combined NOR'ing, inverting, MUX'ing, and latching functions are performed by the single first stage. This single stage replaces the prior art multiple stages for performing the same NOR'ing, inverting, MUX'ing, and latching functions of the present invention. Since the present invention replaces the prior art multiple stages with a single stage, the speed of the present invention in performing the above NOR'ing, inverting, MUX'ing, and latching functions is significantly improved over the prior art. Furthermore, the present invention also discloses a second stage for a low-noise temperature-compensated output circuit. According to this aspect of the present invention, the low temperature noise on the ground and the supply voltage lines is reduced so that the low temperature noise approximately equals the high temperature noise on the ground and the supply voltage lines. Moreover, the speed improvement of the first stage of the present invention, described above, compensates for any speed degradation produced by the low-noise temperature-compensated output circuit of the second stage, so that the overall speed of the first and the second stages of the macrocell of the present invention is still improved over the prior art multiple-stage macrocell.

27 Claims, 4 Drawing Sheets

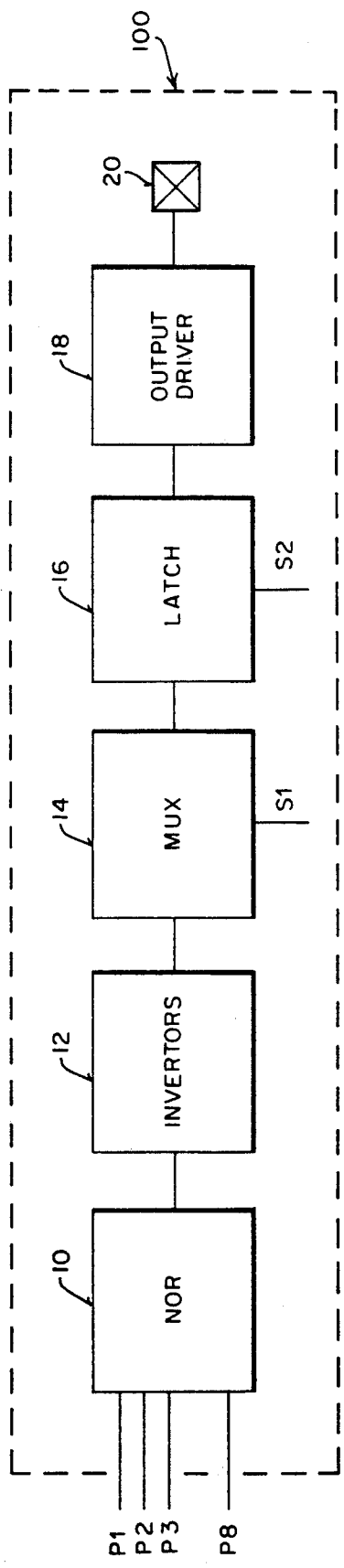
FIG_1 (PRIOR ART)
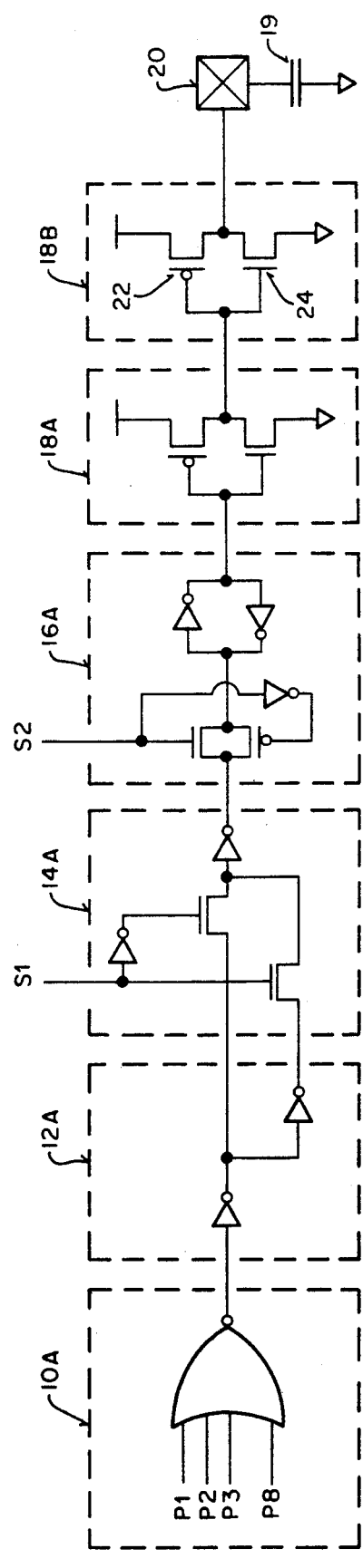
FIG_2 (PRIOR ART)

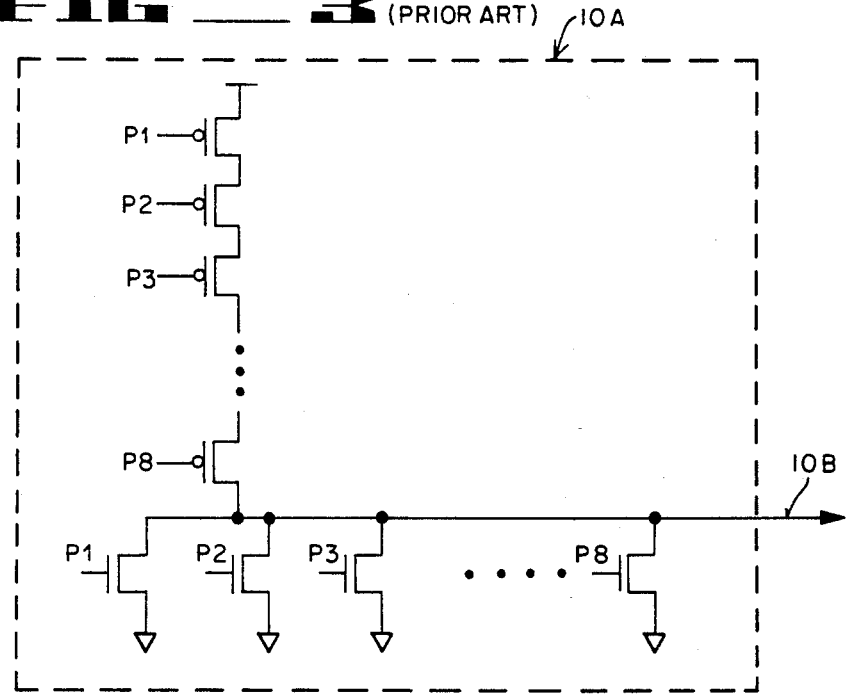
FIG_3 (PRIOR ART)
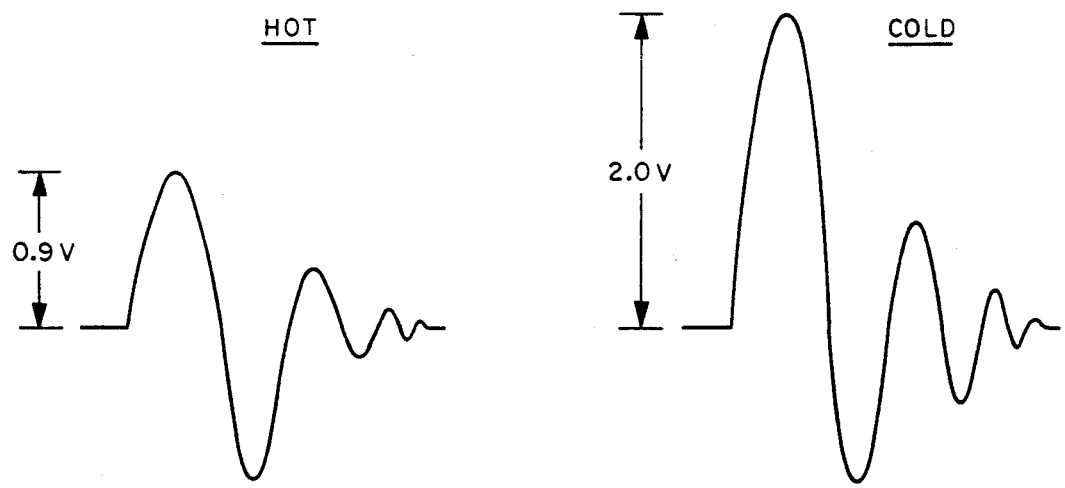
FIG_4 (PRIOR ART)
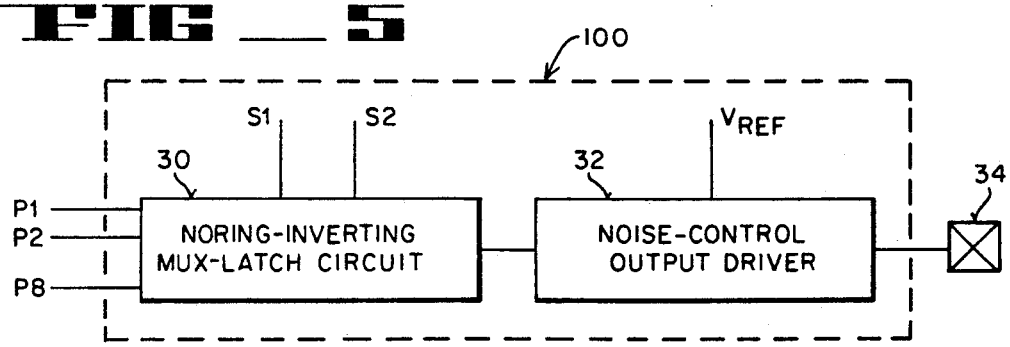
FIG_5

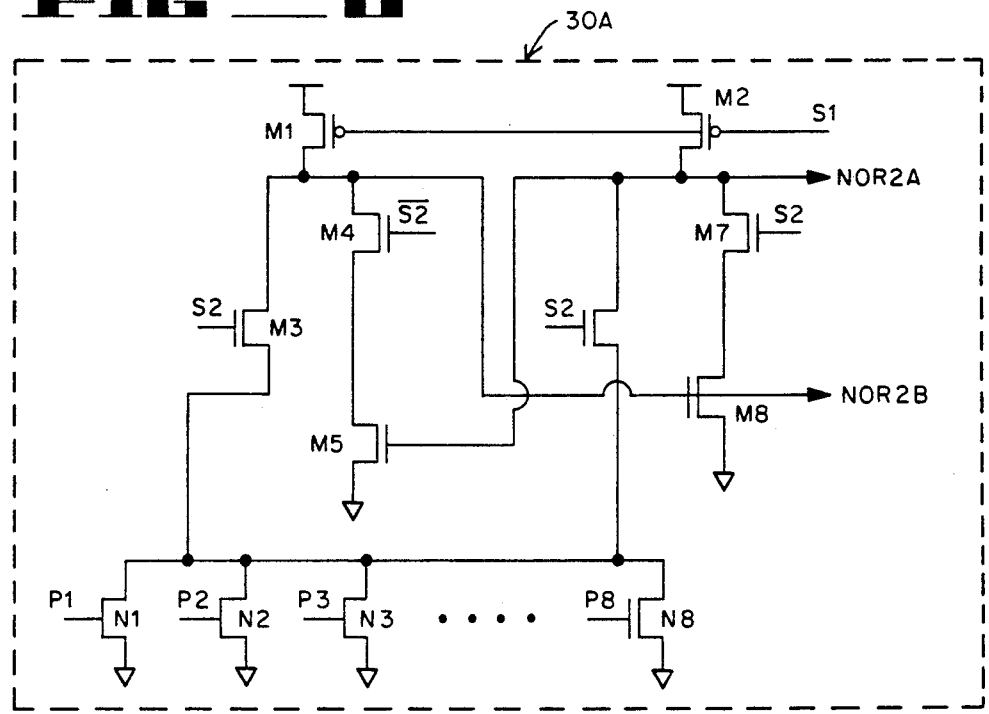
FIG_6
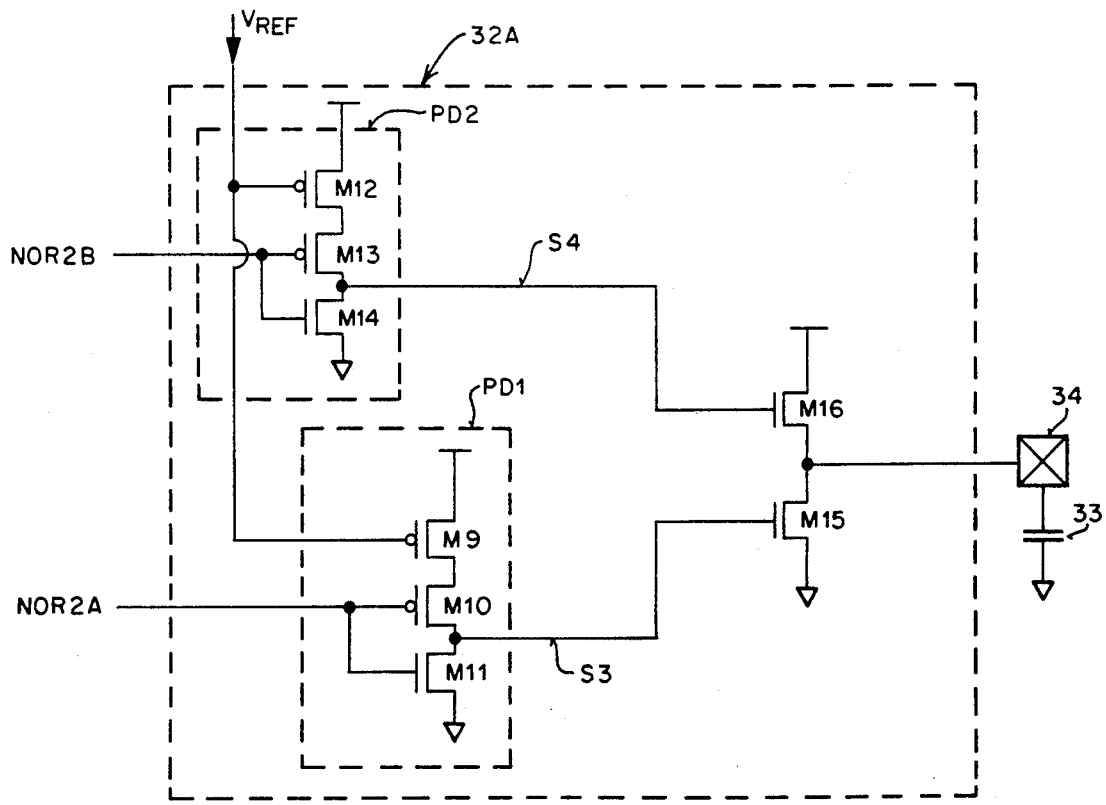
FIG_7

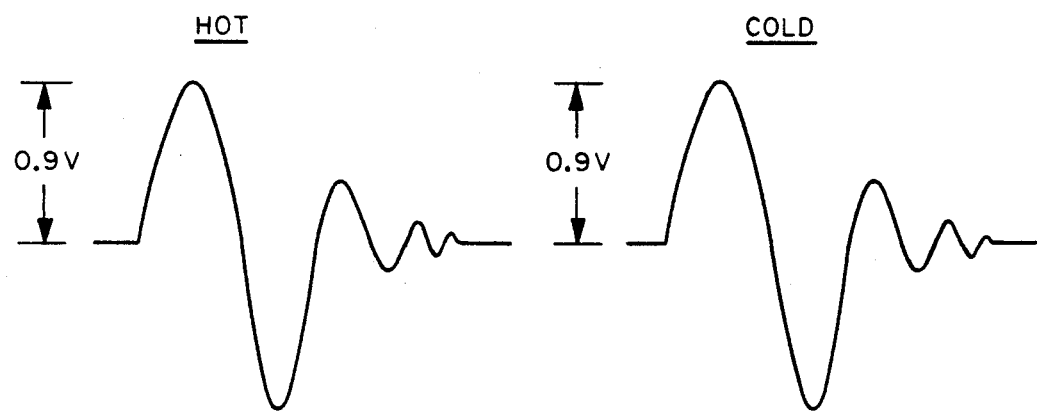
FIG_8
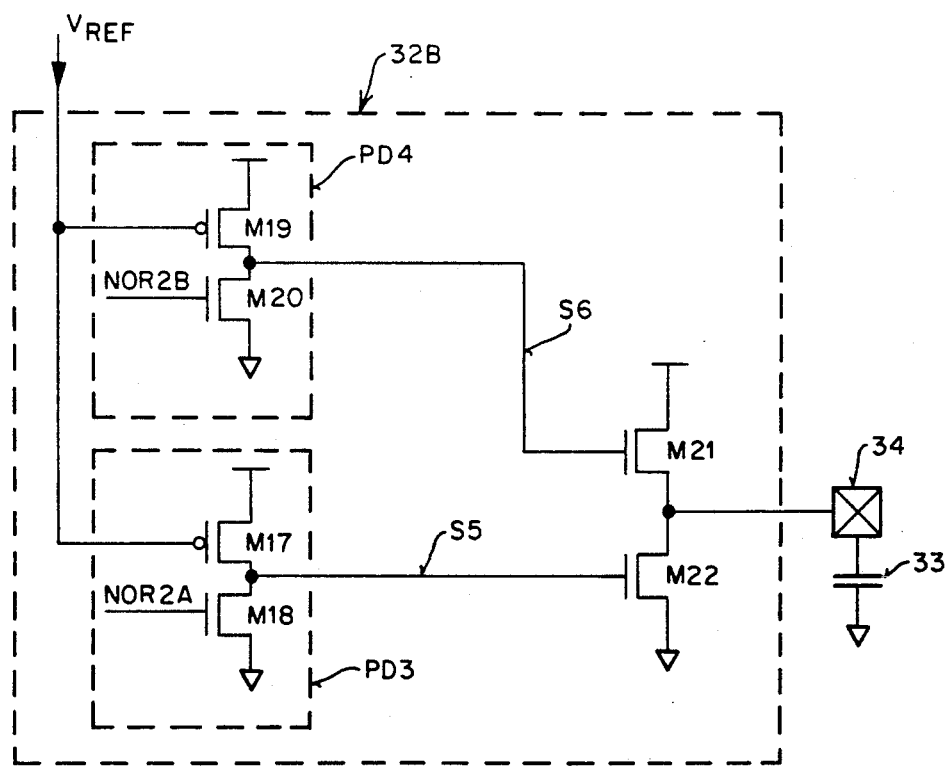
FIG_9

HIGH SPEED NOR'ING INVERTING, MUX'ING AND LATCHING CIRCUIT WITH TEMPERATURE COMPENSATED OUTPUT NOISE CONTROL

BACKGROUND OF THE INVENTION

1. Field of the Present Invention

The present invention relates to the field of Programmable Logic Devices. More particularly, the present invention relates to high speed and low noise circuits for macrocells of Programmable Logic Devices.

2. Description of the Prior Art

FIG. 1 depicts a typical circuit of a prior art Programmable Logic Device macrocell. As shown in FIG. 1, the typical macrocell circuit includes five logic stages comprised of a NOR logic 10, an Invertor logic 12, a MUX logic 14, a Latch 16, an Output Driver logic 18, and finally an output pad 20.

FIG. 2 shows a conventional implementation of the various logic stages of FIG. 1. As shown in FIG. 2, eight product terms P1 through P8 feed a conventional NOR gate 10A. Thereafter, the output of the NOR gate 10A is inverted and buffered by the two invertors of logic block 12A so as to provide a stronger drive for a conventional MUX 14A. Signal S1 of the MUX 14A selects between either the true or the inverse polarity of the output of the NOR gate 10A. Thereafter, a conventional latch 16A stores the data received from MUX 14A. Subsequently, the data stored in latch 16A is passed on by the output predriver 18A to the output driver 18B. Output driver 18B then charges or discharges output pad 20 and its parasitic capacitance represented by a single lumped capacitance 19. Thus, the conventional implementation of the macrocell circuit shown in FIGS. 1 and 2 requires five logic stages.

This typical implementation of NOR'ing of the product terms P1 through P8, and then inverting, MUX'ing, latching, and outputting the NOR'ed result is too slow and produces too much noise on the supply voltage and ground lines. To illustrate these problems, a typical implementation of the NOR gate 10A of FIG. 2 is shown in FIG. 3. As shown in FIG. 3, the charge path of the NOR gate 10A consists of eight P-channel transistors. Since the resistive path from the output of the NOR gate 10A to the supply voltage is equivalent to the series resistance of the eight P-channel transistors, the rise time of the output 10B of the NOR gate 10A is very long. This long rise time in turn necessitates the use of the double inversion circuit 12A of FIG. 2 in order to reduce switching times at the input of the MUX 14A.

Furthermore, the conventional output predriver 18A and output driver 18B of FIG. 2 result in "noisy" ground and supply voltage lines. This noise is generated by the sudden charging or discharging of the output capacitive load, represented by capacitor 19 of FIG. 2. First, the ground noise is discussed as an example: When the output capacitive load is being discharged by N-channel transistor 24, the voltage on the ground line will suddenly fluctuate in response to the discharge current passing through the ground line. This fluctuation of voltage, also called noise in this document, on the ground line is primarily a function of the inductance of the ground wires, the size of the output capacitive load being discharged, and the rate of current being discharged into the ground line. Thus, a reduction in the rate of current flow from the output pad capacitance 19 into the ground line (i.e. the discharge current) reduces the noise voltage on the ground line. Similarly, a reduction in the current flow into the output pad capacitance 19 from the supply voltage (i.e. the charge current) reduces the noise on the supply voltage line.

Moreover, the noise on the ground and the supply voltage lines, produced by the prior art predriver 18A and output driver 18B, further varies in response to the varying ambient temperature. For example, the peak noise level on the ground line at about 70° C. ("hot" ambient condition) is approximately 0.9 volts as shown in FIG. 4. This peak noise level on the ground line is ordinarily tolerated in electronic systems. However, as also shown in FIG. 4, at about 0° C. ("cold" ambient condition) this peak noise level exceeds 2.0 volts on the ground line. Thus, many electronic systems interpret this peak noise level at 0° C. as a "One" rather than a "Zero." As such, this peak noise level causes many electronic systems to malfunction. A similar situation exists regarding the supply voltage noise. Thus, the foregoing discussion regarding the existence of excessive noise on ground line at 0° C. also applies to the supply voltage line.

Therefore, it is critical to reduce the noise on the ground and the supply voltage lines such that the peak noise at 0° C. is equal to the peak noise at 70° C. and therefore a maximum peak noise of approximately 0.9 volts is achieved. The prior art has attempted to accomplish this objective primarily by slowing down the rate of current flow caused by the output driver circuit in discharging or charging the output pad capacitive load. Thus, the prior art slows down the output circuit for both the hot and cold ambient conditions. As such, the output circuit is unnecessarily slowed down at the hot ambient condition. It is noted that the slowing down of the output circuit at the hot ambient condition is, in addition to being unnecessary, further problematic since semiconductor devices already have their poorest speed performance at the hot ambient condition. Thus, although the prior art technique of slowing down the output driver circuit may achieve a reduced noise on the ground and the supply voltage lines, the prior art unnecessarily degrades the speed performance of the output circuit at the hot ambient conditions, where good speed performance is most needed.

It is therefore an object of the present invention to reduce the peak noise on the ground and the supply voltage lines produced by the macrocell of the present invention, while improving the overall speed of the macrocell. Thus, the present invention discloses a new design for Programmable Logic Device macrocells such that the peak noise on the ground and the supply voltage lines is significantly reduced, while the speed performance of the macrocell is also improved.

BRIEF SUMMARY OF THE INVENTION

The present invention discloses an improved two-stage macrocell for Programmable Logic Devices. According to the first stage of the improved circuit of the present invention's macrocell, combined NOR'ing, inverting, MUX'ing, and latching functions are performed by the single first stage. This single stage replaces the prior art multiple stages for performing the same NOR'ing, inverting, MUX'ing, and latching functions of the present invention. Since the present invention replaces the prior art multiple stages with a single stage, the speed of the present invention in performing the above NOR'ing, inverting, MUX'ing, and latching functions is significantly improved over the prior art.

Furthermore, the present invention also discloses a second stage for a low-noise temperature-compensated output circuit. According to this aspect of the present invention, the low temperature noise on the ground and the supply voltage lines is reduced so that the low temperature noise approximately equals the high temperature noise on the ground and the supply voltage lines. Moreover, the speed improvement of the first stage of the present invention, described above, compensates for any speed degradation produced by the low-noise temperature-compensated output circuit of the second stage, so that the overall speed of the first and the second stages of the macrocell of the present invention is still improved over the prior art multiple-stage macrocell.

BRIEF DESCRIPTION OF THE DRAWINGS

FIG. 1 shows the prior art multiple-stage macrocell for performing NOR'ing, inverting, MUX'ing, and latching functions.

FIG. 2 shows the prior art detailed implementation of the several stages of FIG. 1.

FIG. 3 illustrates the prior art detailed implementation of stage 10A of FIG. 2.

FIG. 4 shows the peak noise generated on the ground and the supply voltage lines by the prior art stages 18A and 18B of FIG. 2.

FIG. 5 shows the present invention's two-stage macrocell.

FIG. 6 shows the present invention's detailed implementation of stage 30 of FIG. 5.

FIG. 7 shows the present invention's detailed implementation of stage 32 of FIG. 5.

FIG. 8 illustrates the peak noise generated on the ground and the supply voltage lines by the present invention's circuit 32A of FIG. 7.

FIG. 9 shows the detailed implementation of a second embodiment of stage 32 of FIG. 5 of the present invention.

DETAILED DESCRIPTION OF THE INVENTION

Referring again to FIG. 1, a conventional macrocell of a Programmable Logic Device is shown with its five stages in block diagram form. Now referring to FIG. 5, it is shown that the present invention employs only two stages in its macrocell. As will be shown hereinafter, the speed of the two stage output section of FIG. 5 is higher than that of the five stage section of FIG. 1. Furthermore, the peak noise level produced by the two-stage macrocell of FIG. 5 is much less than that of the five-stage macrocell of FIG. 1.

Still referring to FIG. 5, according to the present invention the output section of a macrocell consists of two stages. The first stage 30 performs a combined NOR'ing, inverting, MUX'ing and latching function. As will be illustrated hereinafter, a major part of the speed improvement of the present invention is a consequence of the fact that the four stages 10, 12, 14, and 16 of the conventional macrocell of FIG. 1 are reduced into the single stage 30 of FIG. 5 of the present invention.

Still referring to FIG. 5, the second stage 32 is comprised of an output predriver circuit and an output driver circuit which are designed to keep the peak noise at the output pad 34 essentially constant across the ambient temperature variations. Thus, the peak noise at the output pad 34 remains essentially unchanged for the hot and cold ambient conditions. This peak noise is about 0.9 volts for the hot ambient condition. Furthermore, according to the present invention, the peak noise is also about 0.9 volts for the cold ambient condition. Thus, according to the present invention, the maximum peak noise at pad 34 remains at approximately 0.9 volts across the ambient temperature variations.

Now a detailed study of the present invention's implementation of the two stages shown in FIG. 5 will illustrate how the objectives of the present invention in reducing the ground and the supply voltage noise is achieved, while the speed performance of the present invention's macrocell is also improved.

FIG. 6 shows the detailed implementation of stage 30 of FIG. 5. It is noted that the macrocell of the present invention shown in FIG. 6 essentially performs, with increased speed, the combined functions of the prior art circuits 10A, 12A, 14A and 16A of FIG. 2. As shown in FIG. 6, transistors N1 through N8 provide the discharge path for the output signals NOR2A and NOR2B of circuit 30A. Also, transistors M1 and M2 comprise the charge path for the output signals NOR2A and NOR2B of circuit 30A. The charge path is controlled by a control signals S1. When control signal S1 is in the high state, no conductive path between ground and the supply voltage can be formed. As such, control signal S1 is used as a power saving feature when the output signals NOR2A and NOR2B of circuit 30A are not needed. In the remaining of the this document it is assumed that circuit 30A is always being used. Thus, in the remaining of this document, signal S1 will be assumed to be in a low state.

The second control signal S2 is used in conjunction with transistors M3, M4, M6, and M8 to perform inverting and MUX'ing functions. For example, if the control signal S2 is in the low state, the output signal NOR2A will represent the true polarity of the NOR'ed result of the product terms P1 through P8, and output signal NOR2B will represent the inverse polarity thereof. Conversely, if the control signal S2 is in the high state, the output signal NOR2B will represent the true polarity of the NOR'ed result of the product terms P1 though P8, while the output signal NOR2A would represent the inverse polarity thereof. Thus, control signal S2 drives transistors M3, M4, M6, and M8 to determine the inverse polarity of the NOR'ed result of the product terms P1 through P8. Further, control signal S2 determines which of the two NOR output signals, NOR2A or NOR2B, will be assigned the true polarity, and which of the two NOR output signals will be assigned the inverse polarity, of the NOR'ed result of the product terms P1 through P8.

Moreover, transistors M3 through M8 of the circuit 30A of FIG. 6, with the addition of some simple control logic to the gates of transistors M3, M4, M6 and M7, also perform a latching function. This latching function is performed by the feedback provided by the NOR2A output signal to the gate of transistor M5, and similarly by the feedback provided by the NOR2B output signal to the gate of transistor M8. To enable the latching function, the gates of transistors M3 and M6 of FIG. 6 are driven to a low value, while the gates of transistors M4 and M7 are driven to a high value. Thus, the voltage of both NOR2A and NOR2B output signals will remain latched in their respective values until the gates of transistor M3, M4, M6 and M7 are driven back to their previous values.

In summary, circuit 30A of the present invention performs a NOR'ing function on the input product terms P1 through P8. Furthermore, circuit 30A performs inverting and MUX'ing functions by inverting the NOR'ed result of the product terms P1 through P8 and assigning the true or the inverse polarities of this NOR'ed result to NOR2A or NOR2B output signal. Also, circuit 30A performs a latching function by temporarily storing the voltages of NOR2A and NOR2B output signals at their respective values. As such, circuit 30A of the present invention performs the combined functions of the stages 10A, 12A, 14A, and 16A of the prior art macrocell shown in FIG. 2.

Thus, because of the reduced number of stages in the present invention, the required time for the performance of the NOR'ing, inverting, MUX'ing, and latching operations is significantly less than the required time of the prior art stages shown in FIG. 2 in performing the same operations.

Referring to FIG. 7, circuit 32A shows the detailed implementation of the Noise-Control Output Driver stage 32 of FIG. 5 of the present invention. As discussed hereinbefore, the primary function of stage 32 of the present invention is to reduce the peak noise in the ground and the supply voltage lines at the cold ambient condition (about 0° C.). In accomplishing this objective, the circuit of FIG. 32A slightly adds to the time delay of stage 32. However, since as discussed above, the total time delay of the macrocell is already significantly reduced by the reduction of the several stages of the prior art into the single stage 30 of the present invention, any speed loss in stage 32 of the present invention is not only compensated for but surpassed by the speed gain of stage 30.

Still referring to FIG. 7, a first output predriver circuit PD1 consists of transistors M9 through M11, a second output predriver circuit PD2 consists of transistors M12 through M14, and the output driver circuit consists of transistors M15 and M16. First, the operation of the predriver PD1 consisting of transistors M9 through M11 is discussed in relation to the ground noise. This predriver drives the output driver transistor M15. Thus, when the predriver output S3 is in the high state, output pad 34 will also be pulled low. Also, when the predriver output S3 is in the low state, the output driver transistor M15 will be shut off so that output pad 34 can be pulled high by the other output driver transistor M16.

Still referring to the output predriver PD1, transistors M10 and M11 form an invertor-like configuration, wherein the output signal S3 is the inverted signal of the input signal NOR2A. However, unlike a typical invertor in which the source of the P-channel transistor M10 would have been connected to the supply voltage, in the predriver PD1 the source of the P-channel transistor M10 is connected to the drain of another P-channel transistor M9. The P-channel transistor M9 is used to limit the current flow in transistor M10. This limiting of the current flow by transistor M9 is in response to the variations of the voltage of current control signal $V_{Ref}$ feeding the gate of transistor M9. Signal $V_{Ref}$ is generated by a Temperature Compensation circuit. The Temperature Compensation circuit generating the $V_{Ref}$ signal is not shown in any of the Figures of this document and its operation is not discussed herein. However, the Temperature Compensation circuit is the means by which the voltage of signal $V_{Ref}$ is varied as a function of the ambient temperature.

Still referring to FIG. 7 and only for the purpose of illustration, it is assumed that the signal $V_{Ref}$ is maintained at ground voltage so that transistor M9 is fully on and thus no current controlling function is performed by signal $V_{Ref}$. Therefore, absent any current control by signal $V_{Ref}$, the resistivity of all P-channel and N-channel transistors of output predriver PD1 decreases as the ambient temperature decreases. Further, at low temperatures the output driver transistor M15 is also less resistive than it is at high temperatures.

Continuing with the assumption of $V_{Ref}$ at ground voltage, as discussed above the P-channel transistors M9 and M10, which are responsible for pulling up the gate of the output driver transistor M15, are less resistive at low temperatures than they are at high temperatures. Therefore, still assuming no current control by signal $V_{Ref}$, not only the output driver transistor M15 is less resistive at low temperatures, but also the gate of transistor M15 is driven quicker, at low temperatures, due to the decreased resistivity of the P-channel transistors M9 and M10 of the predriver PD1. Thus, absent any current control by the control signal $V_{Ref}$, the rate of current flow into the ground line is increased at low temperatures due to both the decreased resistivity of the output driver transistor M15 and the faster drive of the gate of the output driver transistor M15 by the predriver PD1. This increased rate of current flow from the output pad capacitance 33 into the ground line in turn produces the excessive noise on the ground line characteristic of the cold ambient condition as discussed hereinbefore.

Still referring to FIG. 7, the example above with the assumption that $V_{Ref}$ is at ground voltage is now contrasted with the real operation of the output predriver PD1 and the output driver transistor M15 during the real operation of the control signal $V_{Ref}$, without the assumption that the control signal $V_{Ref}$ is at ground voltage. As discussed above, the increased rate of current flow into the ground line, at the cold ambient condition, is partially due to the decreased resistivity of transistors M9 and M10 of the output predriver PD1. Therefore, according to the present invention, at the cold ambient condition, the voltage of the current control signal $V_{Ref}$ is increased and therefore the resistivity of the current limiting transistor M9 is also increased. This increase in the resistivity of the current limiting transistor M9 at the cold ambient condition counters the effect of the reduced resistivity of transistor M10 at the cold ambient condition.

As such, the switching time of the output predriver PD1 is higher when the resistivity of the current limiting transistor M9 is increased by the current control signal $V_{Ref}$, than the switching time of the predriver PD1 when the resistivity of the current limiting transistor M9 is left uncontrolled (i.e. with $V_{Ref}$ at ground voltage). This is because the voltage of the current control signal $V_{Ref}$, when at some value above the ground voltage, limits the current conduction of the current limiting transistors M9 by turning transistor M9 partially off. Thus, an increase in the voltage of signal $V_{Ref}$ and a concomitant increase in the resistivity of transistor M9 compensates for the decrease in resistivity of transistor M10, such that the switching time of the predriver PD1 can be in fact longer at low temperatures than the switching time of the predriver PD1 is at high temperatures.

Thus, an increase in the voltage of the current control signal $V_{Ref}$ is followed by a corresponding increases in the resistivity of the P-channel transistor M9. Therefore, an increase in the voltage of the current control signal $V_{Ref}$ produces a corresponding increase in the switching time of predriver PD1. As such, a sufficiently high value of the voltage of the current control signal $V_{Ref}$ can cancel out the combined effect of a decrease in the resistivity of transistor M10, and a decrease in the resistivity of transistor M15. For example, in accordance with the present invention, $V_{Ref}$ is required to be approximately 2.0 volts for an ambient temperature of 0° Centigrade, so that the peak noise on the ground line is reduced to 0.9 volts which is an acceptable peak noise voltage for electronic systems. However, a peak ground noise of 0.9 volts at an ambient temperature of 70° Centigrade requires a $V_{Ref}$ of only 0.8 volts. Thus, the voltage of the current control signal $V_{Ref}$ is varied in response to the variations of the ambient temperature so that the peak noise on the ground line at low temperatures is reduced to 0.9 volts.

Now, the operation of the output predriver PD2 is discussed in relation to the noise on the supply voltage line. This predriver consists of transistors M12 through M14. Transistors M13 and M14 of predriver PD2, similar to transistors M10 and M11 of predriver PD1, form an invertor-like configuration. However, unlike the configuration of predriver PD1, the input to the invertor-like configuration of the predriver PD2 is the NOR2B signal, and not the NOR2A signal. Thus, the output signal S4 of the predriver PD2 is an inverted signal of the input signal NOR2B. Transistor M12 limits the current flow into transistor M13 in a similar manner that transistor M9 limits the current flow into transistor M10. Thus, this current limiting is accomplished by varying of the voltage of the current control signal $V_{Ref}$ in a similar manner that it was varied for the predriver PD1.

Thus, as in the case of predriver PD1, the voltage of the current control signal $V_{Ref}$ is gradually increased as the ambient temperature decreases and therefore the current flow in the current limiting transistor M13 is restricted as the ambient temperature decreases. At a sufficiently high voltage of the current control signal $V_{Ref}$ the switching time of the output predriver PD2 is increased to a degree that the effect of low temperatures on the noise of the supply voltage line can be entirely compensated for in a similar manner that was described in relation to predriver PD1 and the ground line noise. For example, similar to the case regarding the ground line noise, for a peak noise of approximately 0.9 volts on the supply voltage line, for an ambient temperature of 0° Centigrade, $V_{Ref}$ is required to be approximately 2.0 volts. However, to achieve a peak supply voltage noise of approximately 0.9 volts at 70° Centigrade requires a $V_{Ref}$ of only about 0.8 volts.

Regarding the output driver of the present invention, it is noted that according to the embodiment of stage 32 of FIG. 5 of the present invention shown in FIG. 7, the output driver transistor M16, which is used to charge the output pad parasitic capacitance 33, is an N-channel transistor. The use of the N-channel transistor M16 helps in achieving one of the objectives of the present invention, namely, a reduction in the ground line noise. In that regard, it is recalled that the rate of current flow into the ground line contributes to the noise on the ground line. Further, a lower voltage to which the output pad capacitance 33 is charged produces a lower rate of current flow into the ground line when the output pad capacitance 33 is being discharged by transistor M15. Therefore, a reduction in the maximum voltage achievable by the output pad capacitance 33 results in a reduction of the rate of current flow into the ground line. Since transistor M16 is an N-channel transistor, it cannot charge the output pad capacitance 33 all the way up to the supply voltage. This is because transistor M16 will be turned off as soon as the voltage at its source, namely the voltage at the output pad, reaches a value that leaves the gate to source voltage difference less than the threshold voltage of an N-channel transistor. Thus, since an N-channel transistor cannot charge the output pad capacitance 33 all the way up to the supply voltage, the use of the N-channel transistor M16 instead of a P-channel transistor results in less noise on the ground line when the output pad capacitance 33 is being discharged through transistor M15.

The above explanation regarding the reduction of the ground line noise by the use of the N-channel transistor M16 is further illustrated by an example. Thus, assuming that the supply voltage is at 5.0 volts, and that the threshold voltage of an N-channel transistor during the time that the N-channel transistor is charging the output pad capacitance is approximately 1.5 volts, the output pad capacitance 33 cannot be charged to a voltage higher than 3.5 volts. As discussed above, when the output pad is at 3.5 volts, the difference between the gate and the source voltage of transistor M16 is equal to the threshold voltage of transistor M16, namely 1.5 volts, and therefore transistor M16 will be turned off and unable to continue to charge the output pad capacitance 33 to a voltage above 3.5 volts.

Now referring to FIG. 8, it is shown that, according to the present invention, the peak noise on either the ground or the supply voltage line is maintained at approximately 0.9 volts at both the hot ambient condition (about 70° C.) or the cold ambient condition (about 0° C.).

FIG. 9 shows a second embodiment of stage 32 of FIG. 5 of the present invention. This embodiment of stage 32 is similar to the preferred embodiment of stage 32 shown in FIG. 7. However, in the preferred embodiment of stage 32 shown in FIG. 7, the invertor-like configuration which was formed by the transistor pair M10 and M11 or the transistor pair M13 and M14 has been replaced by the single N-channel transistor M18 of predriver PD3 or the single N-channel transistor M20 of predriver PD4 respectively. The output signal S5 of predriver PD3 and the output signal S6 of predriver PD4 have similar functions as their counterpart signals S3 and S4 of FIG. 7.

Now the operation of predriver PD3 is discussed for the purpose of illustration. It is noted that because there is no P-channel transistor connected in an invertor-like configuration with transistor M18 of predriver PD3, there will be a current flow from the supply voltage to the ground when signal NOR2A is in a high state. Thus, predriver PD3 uses only two transistors as contrasted with the three transistors that were used in predriver PD1 of the preferred embodiment of stage 32 shown in FIG. 7. However, the configuration of predriver PD3 results in a higher current consumption than the configuration of predriver PD1. Therefore, the circuit of predriver PD3 consumes more power than the circuit of predriver PD1. The operation of predriver PD4 is similar to that of predriver PD3 and is therefore not discussed herein.

In summary, the present invention discloses the design of a macrocell of a Programmable Logic Device in which the ground noise and the supply voltage noise are reduced to the acceptable level of 0.9 volts for a low ambient temperature of about 0° Centigrade. Further, according to the present invention, not only the speed of the macrocell is not degraded, but the speed of the macrocell is actually improved while achieving the noise reduction in the ground and the supply voltage lines.

According to the present invention, the reduction in the ground or the supply voltage noise at low temperatures is achieved by lowering the rate of current flow into the ground line or out of the supply voltage line respectively. This reduced noise in the ground and the supply voltage lines at low temperatures (about 0° C.) is approximately equal to the ground and the supply voltage noise at high temperatures (about 70° C.). Furthermore, the speed improvement of the macrocell of the present invention is achieved by replacing the several stages of the prior art implementation of NOR'ing, inverting, MUX'ing, and latching functions with a single stage in the present invention. Thus, a single stage of the present invention performs the combined NOR'ing, inverting, MUX'ing, and latching functions of the prior art.

Finally, while the present invention has been disclosed and described with respect to preferred embodiments thereof, it will be understood that the circuits of present invention may be varied without departing from the spirit and scope thereof.

We claim:

1. A Programmable Logic Device macrocell having a plurality of macrocell input lines, said Programmable Logic Device macrocell further comprising:
   NOR'ing means for generating two NOR output signals and assigning to either of said two NOR output signals a value of the true plurality of the NOR'ed result of said plurality of macrocell input lines;
   said NOR'ing means further comprising inverting means for assigning to either of said two NOR output signals a value of the inverse polarity of the NOR'ed result of said plurality of macrocell input lines;
   said NOR'ing means further comprising MUX'ing means for assigning said true polarity of said NOR'ed result to one of said two NOR output lines, and for assigning said inverse polarity of said NOR'ed result to the other of said two NOR output lines;
   output predriver means coupled to said two NOR output signals for reducing noise on ground and supply voltage lines in response to variations of ambient temperature by varying the switching time of said output predriver in response to variations in ambient;

2. The Programmable Logic Device macrocell of claim 1, wherein said NOR'ing means is further means for temporarily storing values of each of said two NOR output lines.

3. The Programmable Logic Device macrocell of claim 1, wherein said output predriver means provides for reducing said output predriver's switching time in response to rising ambient temperatures.

4. The Programmable Logic Device macrocell of claim 1, wherein said output predriver means further provides for increasing said output predriver's switching time in response to declining ambient temperatures.

5. The Programmable Logic Device macrocell of claim 1 further including output driver means for driving an output capacitance of said macrocell of said Programmable Logic Device.

6. The Programmable Logic Device macrocell of claim 5, wherein said output predriver means and said output driver means further provide for reducing noise on ground and supply voltage lines in response to declining ambient temperatures.

7. A Programmable Logic Device macrocell having a plurality of macrocell input lines, said Programmable Logic Device macrocell further comprising:
   NOR'ing means for receiving said plurality of macrocell input lines, generating two NOR output signals, and assigning to either of said two NOR output signals a value of the true polarity of the NOR'ed result of said plurality of macrocell input lines;
   said NOR'ing means further comprising inverting means for assigning to either of said two NOR output signals a value of the inverse polarity of the NOR'ed result of said plurality of macrocell input lines;
   said NOR'ing means further comprising MUX'ing means for assigning said true polarity of said NOR'ed result to one of said two NOR output lines, and assigning said inverse polarity of said NOR'ed result to the other of said two NOR output lines;
   said NOR'ing means further comprising latching means for temporarily storing said values of each of said two NOR output lines;
   output predriver means coupled to said two NOR output signals for reducing noise on ground and supply voltage lines in response to a declining ambient temperature by reducing the switching time of said output predriver in response to a rising ambient temperature
   and for increasing said output predriver's switching time in response to a declining ambient temperature; and
   output driver means for driving an output capacitance of said macrocell of said Programmable Logic Device.

8. The Programmable Logic Device macrocell of claim 7, wherein said NOR'ing means further includes a discharge path to ground comprised of a plurality of N-channel transistors.

9. The Programmable Logic Device macrocell of claim 7, wherein said NOR'ing means further includes a charge path to supply voltage comprised of a plurality of P-channel transistors.

10. The Programmable Logic Device macrocell of claim 7, wherein asid NOR'ing means further includes a plurality of inverting signals for providing an inverse polarity of said NOR'ed result of said plurality of macrocell input lines to one of said NOR output signals of said NOR'ing means, and wherein said plurality of inverting signals include said NOR output signals, wherein said NOR output signals drive a plurality of transistors for providing the inverse polarity of the NOR'ed result of said macrocell input lines to one of said NOR output signals.

11. The Programmable Logic Device macrocell of claim 7, wherein said NOR'ing means further includes a plurality of MUX'ing signals for assigning to said NOR output signals of said NOR'ing means the true or inverse polarities of said NOR'ed result of said plurality of macrocell input lines, said plurality of MUX'ing signals include said NOR output signals, wherein said NOR output signals drive a plurality of transistors of said NOR'ing means so as to selectively couple said NOR output signals of said NOR'ing means to ground or to supply voltage.

12. The Programmable Logic Device macrocell of claim 7, wherein said NOR'ing means further includes a plurality of latching signals for temporary storage of said NOR'ed result of said plurality of macrocell input lines, said plurality of latching signals include said NOR output signals, wherein said NOR output signals drive a plurality of transistors for temporarily storing the voltage of each of said NOR output signals at their respective values.

13. The Programmable Logic Device macrocell of claim 7, wherein said output predriver means further receives a current control signal, wherein the voltage of said current control signal is dependent on the ambient temperature and wherein said current control signal drives a plurality of current limiting transistors, thereby increasing the resistivity of said plurality of current limiting transistors in response to declining temperatures so as to increase the switching time of said output predriver in response to declining temperatures.

14. The Programmable Logic Device macrocell of claim 7, wherein said output predriver means further receives a current control signal, wherein the voltage of said current control signal is dependent on the ambient temperature and wherein said current control signal drives a plurality of current limiting transistors, thereby decreasing the resistivity of said plurality of current limiting transistors in response to rising temperatures so as to reduce the switching time of said output predriver in response to rising temperatures.

15. The Programmable Logic Device macrocell of claim 7, wherein said output driver means further includes an N-channel transistor for discharging said output capacitance to ground.

16. The Programmable Logic Device macrocell of claim 7, wherein said output driver means further includes an N-channel transistor for charging said output capacitance so as to cause the output capacitance to reach a voltage between the voltage of ground and the supply voltage.

17. The Programmable Logic Device macrocell of claim 7, wherein said noise on the ground and the supply voltage lines at 0° Centigrade is approximately equal to said noise on the ground and the supply voltage lines at 70° Centigrade.

18. The Programmable Logic Device macrocell of claim 17, wherein said noise level at 0° Centigrade being equal to said noise level at 70° Centrigrade has a peak value of approximately 0.9 volts.

19. A Programmable Logic Device macrocell having a plurality of macrocell input lines, said Programmable Logic Device macrocell further comprising:
   NOR'ing means for generating two NOR output signals, said NOR'ing means providing a discharge path to ground comprising a plurality of N-channel transistors and a charge path to supply voltage comprising a plurality of P-channel transistors;
   said NOR'ing means further comprising a plurality of inverting signals, said plurality of inverting signals including said NOR output signals, wherein said NOR output signals drive a plurality of transistors for providing the inverse polarity of the NOR'ed result of said macrocell input lines to one of said NOR output signals;
   said NOR'ing means further comprising a plurality of MUX'ing signals, said plurality of MUX'ing signals including said NOR output signals, wherein said NOR output signals drive a plurality of transistors of said NOR'ing means so as to selectively couple said NOR output signals of said NOR'ing means to ground or to supply voltage;
   said NOR'ing means further comprising a plurality of latching signals for temporarily storing said NOR'ed result of said plurality of macrocell input lines, said plurality of latching signals including said NOR output signals, wherein said NOR output signals drive a plurality of transistors for temporarily storing the voltage of each of said NOR output signals at the respective values;
   output predriver means coupled to said two NOR output signals comprising a plurality of current limiting transistors for receiving a current control signal, the voltage of said current control signal being dependent on the ambient temperature, and wherein said current control signal drives said plurality of current limiting transistors, thereby increasing the resistivity of said plurality of current limiting transistors in response to a declining ambient temperature so as to increase the switching time of said output predriver in response to a declining ambient temperature;
   said output predriver means further comprising a plurality of current limiting transistors for receiving a current control signal, the voltage of said current control signal being dependent on the ambient temperature, and wherein said current control signal drives said plurality of current limiting transistors, thereby decreasing the resistivity of said plurality of current limiting transistors in response to a rising ambient temperature so as to decrease the switching time of said output driver in response to a rising ambient temperature;
   output driver means comprising an N-channel transistor for reducing noise on ground and supply voltage lines in response to declining ambient temperature by charging an output capacitance so as to cause said output capacitance to reach a voltage between the voltage of ground and the supply voltage.

20. The Programmable Logic Device macrocell of claim 19, wherein said plurality of macrocell input lines are comprised of eight input lines, and wherein said NOR'ing means includes eight N-channel transistors for discharging said two NOR output signals to ground, said NOR'ing means further including six additional N-channel transistors for performing inverting, MUX'ing and latching functions.

21. The Programmable Logic Device macrocell of claim 19, wherein the charge path for said two NOR output signals is comprised of two P-channel transistor driven by a control signal for decreasing the power consumption of said NOR'ing means during times in which said NOR'ing means is not used.

22. The Programmable Logic Device macrocell of claim 19, wherein said output predriver further includes a first pair of one P-channel and one N-channel transistor with common gates, which gates are coupled to the true polarity of the NOR'ed result of said plurality of macrocell input lines.

23. The Programmable Logic Device macrocell of claim 19, wherein said output predriver further includes a second pair of one P-channel and one N-channel transistor with common gates, which gates are coupled to the inverse polarity of the NOR'ed result of said plurality of macrocell input signals.

24. The Programmable Logic Device macrocell of claim 19, wherein said output predriver includes a first N-channel transistor for receiving the true polarity of the NOR'ed result of said plurality of macrocell input lines.

25. The Programmable Logic Device macrocell of claim 24, wherein said output predriver includes a second N-channel transistor for receiving the inverse polarity of the NOR'ed result of said plurality of macrocell input lines.

26. The Programmable Logic Device macrocell of claim 19, wherein said noise on the ground and the supply voltage lines at 0° Centigrade is approximately equal to said noise on the ground and the supply voltage lines at 70° Centigrade.

27. The Programmable Logic Device macrocell of claim 26, wherein said noise level at 0° Centigrade being equal to said noise level at 70° Centigrade has a peak value of approximately 0.9 volts.

* * * * *

UNITED STATES PATENT AND TRADEMARK OFFICE
CERTIFICATE OF CORRECTION

PATENT NO. : 5,168,178
DATED : December 1, 1992
INVENTOR(S) : Michael J. Allen, et al

It is certified that error appears in the above-indentified patent and that said Letters Patent is hereby corrected as shown below:

Col. 9, Line 55     After the word "ambient" insert--temperature--

Col. 11, Line 39    After the word "put" insert--pad--

Col. 11, Line 42    Before the first occurrence of "capacitance" insert--pad--

Col. 11, Line 42    After the word "output" insert--pad--

Signed and Sealed this

Eighteenth Day of July, 1995

Attest:

BRUCE LEHMAN

*Attesting Officer*     *Commissioner of Patents and Trademarks*